(12) United States Patent
Yang et al.

(10) Patent No.: US 8,097,484 B1
(45) Date of Patent: Jan. 17, 2012

(54) SOLAR CELL RECEIVER COMPONENT PLACEMENT CONTROL WITH POSITIONING RECEPTACLES

(75) Inventors: Lei Yang, Albuquerque, NM (US); James Foresi, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 0 days.

(21) Appl. No.: 12/727,022

(22) Filed: Mar. 18, 2010

(51) Int. Cl.
*H01L 21/00* (2006.01)

(52) U.S. Cl. ............ 438/66; 438/64; 257/E21.511; 257/E21.51; 136/259

(58) Field of Classification Search ............ 438/77, 438/67, 66, 64; 257/E21.511, E21.51, E39.127; 136/262, 259, 291
See application file for complete search history.

(56) References Cited

U.S. PATENT DOCUMENTS

| | | | |
|---|---|---|---|
| 2009/0014056 A1* | 1/2009 | Hockaday | 136/247 |
| 2010/0018570 A1 | 1/2010 | Cashion et al. | |
| 2010/0279439 A1* | 11/2010 | Shah et al. | 438/15 |
| 2010/0313954 A1 | 12/2010 | Seel et al. | |
| 2010/0326492 A1* | 12/2010 | Tan et al. | 136/246 |
| 2011/0014725 A1* | 1/2011 | Abiko et al. | 438/4 |

FOREIGN PATENT DOCUMENTS

DE 102008055475 A1 * 6/2010

OTHER PUBLICATIONS

Translation of DE102008055475 A1 Koestler et al (Jun. 10, 2010) 6 pages.*

* cited by examiner

*Primary Examiner* — Caridad Everhart

(57) ABSTRACT

A method of manufacturing a solar cell receiver includes providing an insulative substrate having a metallized surface with a first conductive region separated from a second conductive region. The first conductive region forms a first terminal of the solar cell receiver and the second conductive region forms a second terminal of the solar cell receiver. The metallized surface has receptacles positioned around attachment regions with each attachment region corresponding to a different portion of the metallized surface. The method further includes positioning a material within the receptacles, placing a solar cell on the first conductive region and on a first one of the attachment regions, placing a second component on a second one of the attachment regions, placing a third component on a third one of the attachment regions and attaching the solar cell, the second component, and the third component to the metallized surface.

23 Claims, 6 Drawing Sheets

SOLAR CELL RECEIVER COMPONENT PLACEMENT CONTROL WITH POSITIONING RECEPTACLES

REFERENCE TO RELATED APPLICATIONS

This application is related to U.S. patent application Ser. No. 12/485,684, filed on 16 Jun. 2009.

BACKGROUND

1. Field of the Invention

The present application is directed to manufacturing solar cell receivers, more particularly to precisely aligning and soldering solar cell receiver components on a metallized substrate.

2. Description of the Related Art

Direct Bonded Copper (DBC) substrates provide good heat and current transfer capability in addition to good electrical insulation, making DBC a suitable substrate choice for solar cell receiver applications. A typical DBC includes a ceramic member made of Alumina, AlN, BeO, etc. and a sheet of copper bonded to one or both sides of the ceramic member by a high-temperature oxidation process. The metallized surface of the DBC substrate is usually finished with nickel and immersion gold plating prior to any components being mounted on the substrate.

Components of a solar cell receiver such as a solar cell, bypass diode and electrical connectors are typically soldered to the metallized surface of the DBC substrate. For example, a solder paste can be screen printed onto certain portions of the DBC substrate which correspond to where the components are to be attached to the substrate. The components are then placed on the substrate. The DBC substrate is heated at an elevated temperature sufficient for the solder paste to reflow, attaching the components to the substrate.

The components often move around during solder reflow, causing the components to become misaligned from their initial desired placement. A solder mask or solder stop can be applied to the mounting surface of the DBC substrate for reducing component movement during the solder reflow process, but doing so significantly increases the cost of the solar cell receiver. In addition, it is undesirable to have a solder mask or other organic material on the mounting surface of the DBC substrate, since such materials can burn under high concentrations of stray sun beams which may arise if the solar cell receiver system does not perfectly track the sun.

Absent proper positioning control of the solar cell receiver components during assembly, the components become misaligned regardless of how accurate the components can be initially placed on a substrate. Movement during the solder reflow process typically results in a component positioning inaccuracy of +/−0.5 mm or more, which is problematic for subsequent receiver assembly processes. It is therefore desirable to control component positioning accuracy on a DBC substrate during the component attachment process.

SUMMARY

1. Objects of the Invention

It is an object of the present invention to provide a method of manufacturing a solar cell receiver including a solar cell and corresponding support components which are precisely aligned with and attached to a metallized insulative substrate.

It is also another object of the present invention to provide an insulative substrate with a metallized surface having receptacles which demarcate attachment regions for different components of a solar cell receiver, a material being positioned in the receptacles for preventing solder from flowing beyond the attachment regions.

It is still another object of the present invention to provide an insulative substrate with a metallized surface having alignment marks for guiding placement of solar cell receiver components on the metallized surface.

Some implementations may achieve fewer than all of the foregoing objects.

2. Features of the Invention

Briefly, and in general terms, the present invention provides a method of manufacturing a solar cell receiver including providing an insulative substrate having a metallized surface with a first conductive region separated from a second conductive region. The first conductive region forms a first terminal of the solar cell receiver and the second conductive region forms a second terminal of the solar cell receiver. The metallized surface has receptacles positioned around attachment regions with each attachment region corresponding to a different portion of the metallized surface. The method further includes positioning a material within the receptacles, placing a solar cell on the first conductive region and on a first one of the attachment regions, placing a second component on a second one of the attachment regions, placing a third component on a third one of the attachment regions and attaching the solar cell, the second component, and the third component to the metallized surface.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

Some implementations or embodiments may incorporate or implement fewer of the aspects or features noted in the foregoing summaries.

BRIEF DESCRIPTION OF THE DRAWINGS

These and other features and advantages of this invention will be better understood and more fully appreciated by reference to the following detailed description when considered in conjunction with the accompanying drawings, wherein.

Figure 1:
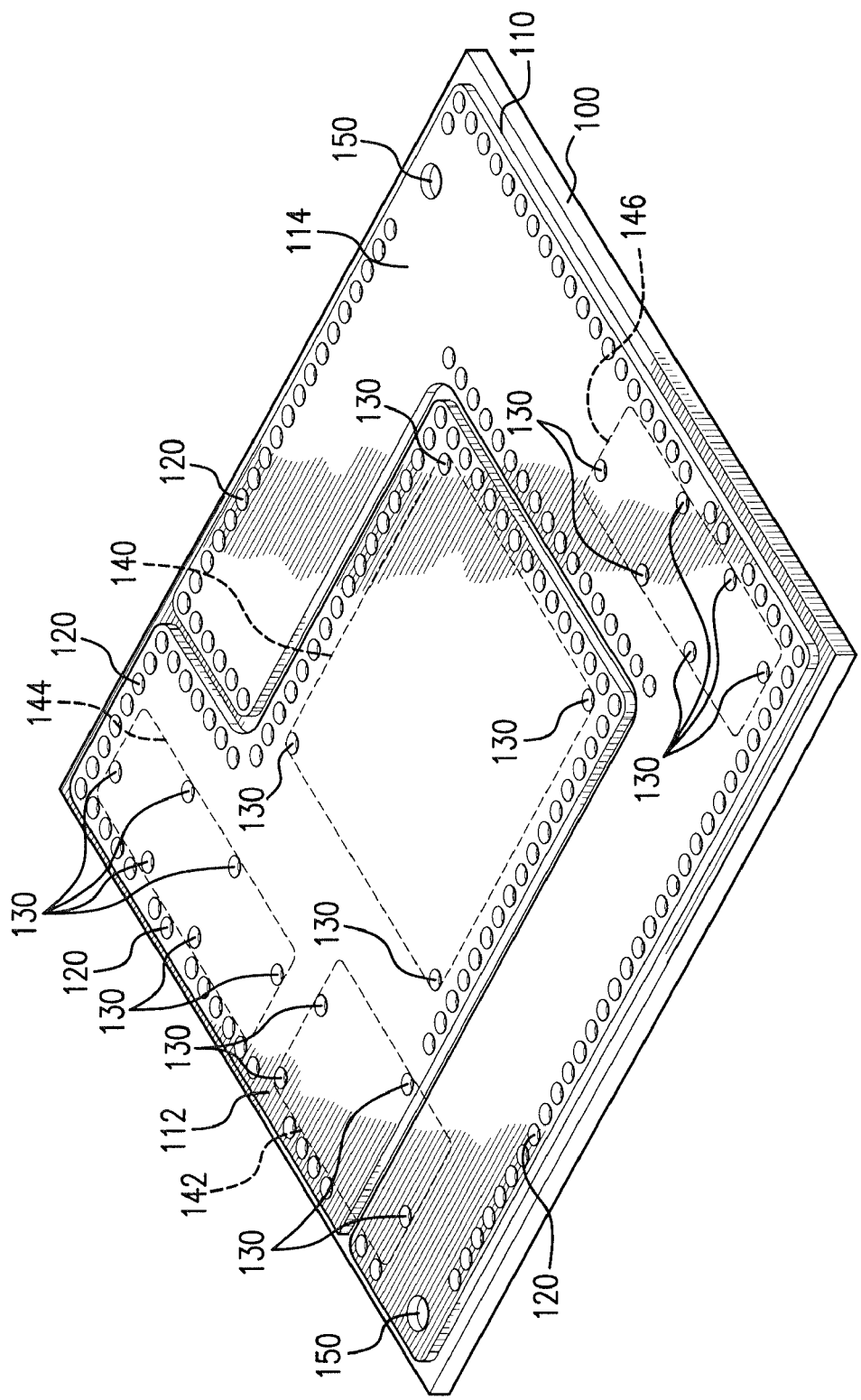
FIG. 1 is a top perspective view of a metallized substrate in accordance with one embodiment.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DETAILED DESCRIPTION

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present invention relates generally to manufacturing a solar cell receiver including a solar cell and corresponding support components which are precisely aligned with and attached to a metallized insulative substrate.

Solar cell receivers include a solar cell for converting solar energy into electricity. In various implementations described herein, a multijunction III-V compound semiconductor solar cell is employed, but other types of solar cells could be used depending upon the application. For example, a triple-junction III-V compound semiconductor solar cell which includes a top cell, a middle cell and a bottom cell arranged in series can be used. In another embodiment, a multijunction solar cell having n-on-p polarity and being composed of InGaP/(In)GaAs III-V compounds on a Ge substrate can be employed. Solar cell receivers often contain additional components, e.g., bypass diodes and connectors for coupling to an output device or other solar cell receivers. The solar cell receiver components are attached to a metallized surface of an insulative substrate.

FIG. 1 illustrates an embodiment of an insulative substrate 100 for mounting of solar cell receiver components. In one embodiment, the substrate 100 is made of a ceramic material such as Alumina, AlN, BeO, etc. and includes a metal sheet such as copper bonded to one or both sides of the ceramic substrate 100 by a high-temperature oxidation process to form a metallized top side 110 and optionally a metallized bottom side (out of view), e.g. as disclosed in U.S. patent application Ser. No. 12/485,684, filed on 16 Jun. 2009, the content of which is incorporated herein by reference in its entirety. In one embodiment, the substrate 100 is a DBC substrate.

The metallized top side 110 of the substrate 100 has separated conductive regions 112 and 114 for providing isolated electrically conductive paths. In one embodiment, the first conductive region 112 provides an anode terminal for a solar cell receiver and the second conductive region 114 provides a cathode terminal for the solar cell receiver. The first conductive region 112 of the substrate 100 is electrically isolated from the second conductive region 114 to ensure proper solar cell receiver operation. In an embodiment, the first conductive region 112 is at least partly surrounded on three sides by the second conductive region 114 about a periphery region of the substrate 100.

The metallized top side 110 of the substrate 100 can be formed of a variety of conductive materials, e.g., copper, silver, and/or gold-coated silver. The metallized top side 110 can be finished with nickel and immersion gold plating prior to solar cell receiver components being mounted on the substrate 100. Holes 120 can be formed in the metallized top side 110 and filled with solder or other type of bonding material such as an adhesive to attach the conductive regions 112 and 114 of the metallized top side 110 to the substrate 100. The bottom side of the substrate 100 can be similarly metallized.

The metallized top side 110 of the substrate 100 includes receptacles 130 spaced apart from the holes 120. Different groups of the receptacles 130 demarcate different component attachment regions 140, 142, 144 and 146 on the metallized top side 110. The receptacles 130 can be recesses formed in the metallized top side 110 such as divots or dimples, or holes formed through the metallized top side 110. Each attachment region 140, 142, 144 and 146 corresponds to a different portion of the metallized top side 110 on which solar cell receiver components are to be mounted. For example, a first attachment region 140 corresponds to where a solar cell is to be mounted on the substrate 100. A second attachment region 142 corresponds to where a bypass diode is to be mounted on the substrate 100. Third and fourth attachment regions 144 and 146 correspond to where respective anode and cathode terminal connectors are to be mounted on the substrate 100. Alignment marks 150 spaced away from the holes 120 and the receptacles 130 can also be formed in the metallized top side 110 of the substrate 100. The alignment marks 150 enable proper alignment of the solar cell receiver components relative to the metallized top side 110 of the substrate 100.

Figure 2:
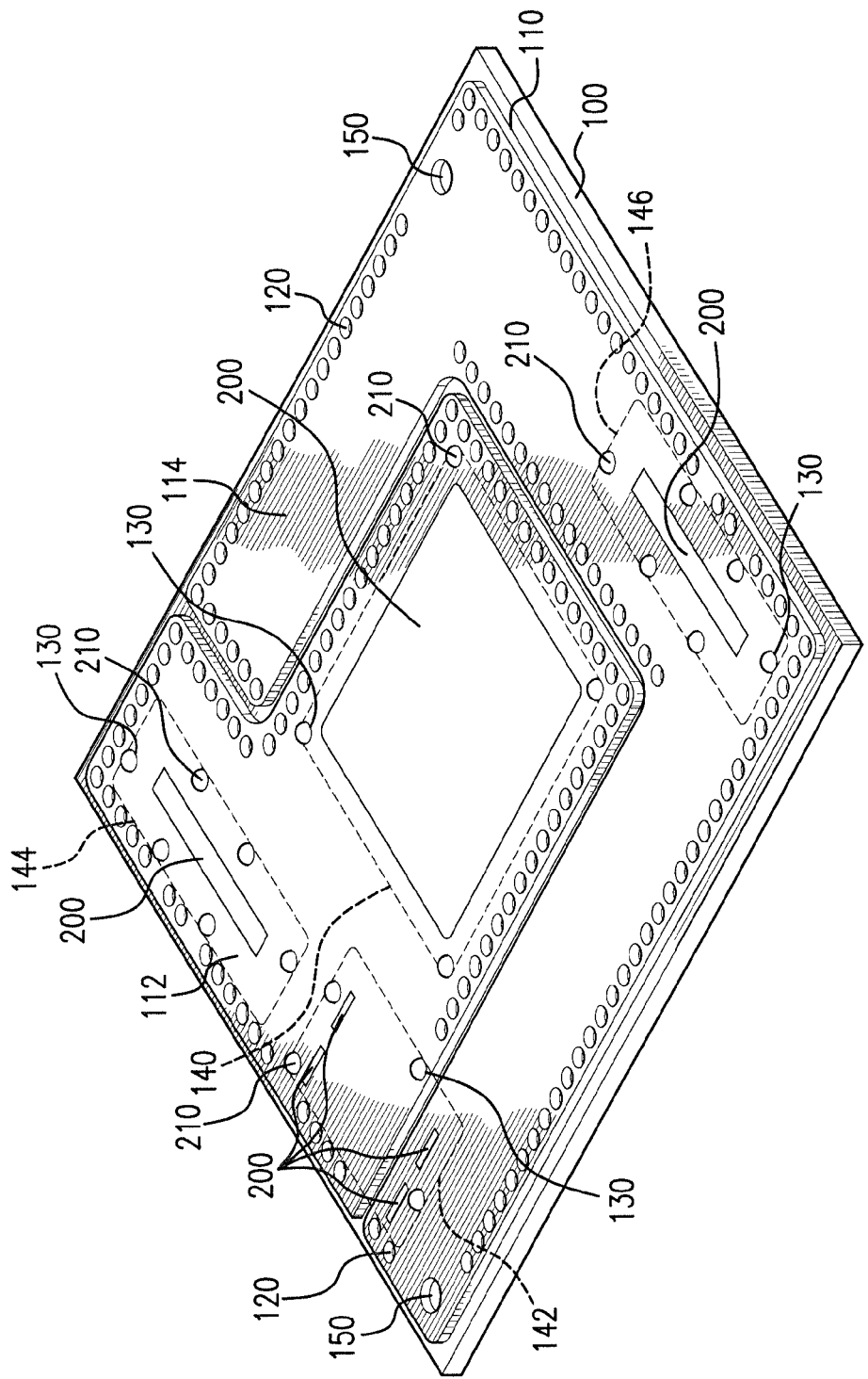
FIG. 2 is a top perspective view of the metallized substrate of FIG. 1 after a solder repelling material is positioned in receptacles formed in the metallized substrate.

FIG. 2 shows the substrate 100 after a solder material 200 such as solder paste is applied to the metallized surface on each attachment region 140, 142, 144 and 146. The solder material 200 is subsequently reflowed after the solar cell receiver components are placed on the respective attachment regions 140, 142, 144 and 146 for attaching the components to the metallized top side 110 of the substrate 100. In addition to applying the solder material 200 on the attachment regions 140, 142, 144 and 146, another material 210 is positioned within the receptacles 130.

According to one embodiment, the material 210 positioned within the receptacles 130 is a solder-repelling material that maintains the solder material 200 within the respective attachment regions 140, 142, 144 and 146 while the solar cell receiver components are attached to the metallized top side 110 by reflowing the solder 200. The solder-repelling material 210 therefore prevents solder from flowing beyond the attachment regions 140, 142, 144 and 146. The solder-repelling material 210 e.g. a solder mask material is dispensed into the receptacles 130 and demarcates the component attachment regions 140, 142, 144 and 146. In one embodiment, the solder-repelling material 210 extends outward from the receptacles 130 above the metallized top side 110 of the substrate 100. If the receptacles 130 are filled with a solder mask material, the solder mask material is selected so that its cure temperature is higher than the reflow temperature of the solder material 200 applied to the component attachment regions 140, 142, 144 and 146 so that the solder mask material remains un-cured during the solder reflow and thus acts as a solder stop, preventing the solder from flowing beyond the respective attachment regions 140, 142, 144 and 146. The attachment regions 140, 142, 144 and 146 are demarcated by the receptacles 130 and thus define a maximum allowed boundary in which the solar cell receiver components are permitted to move during solder reflow.

Figure 3:
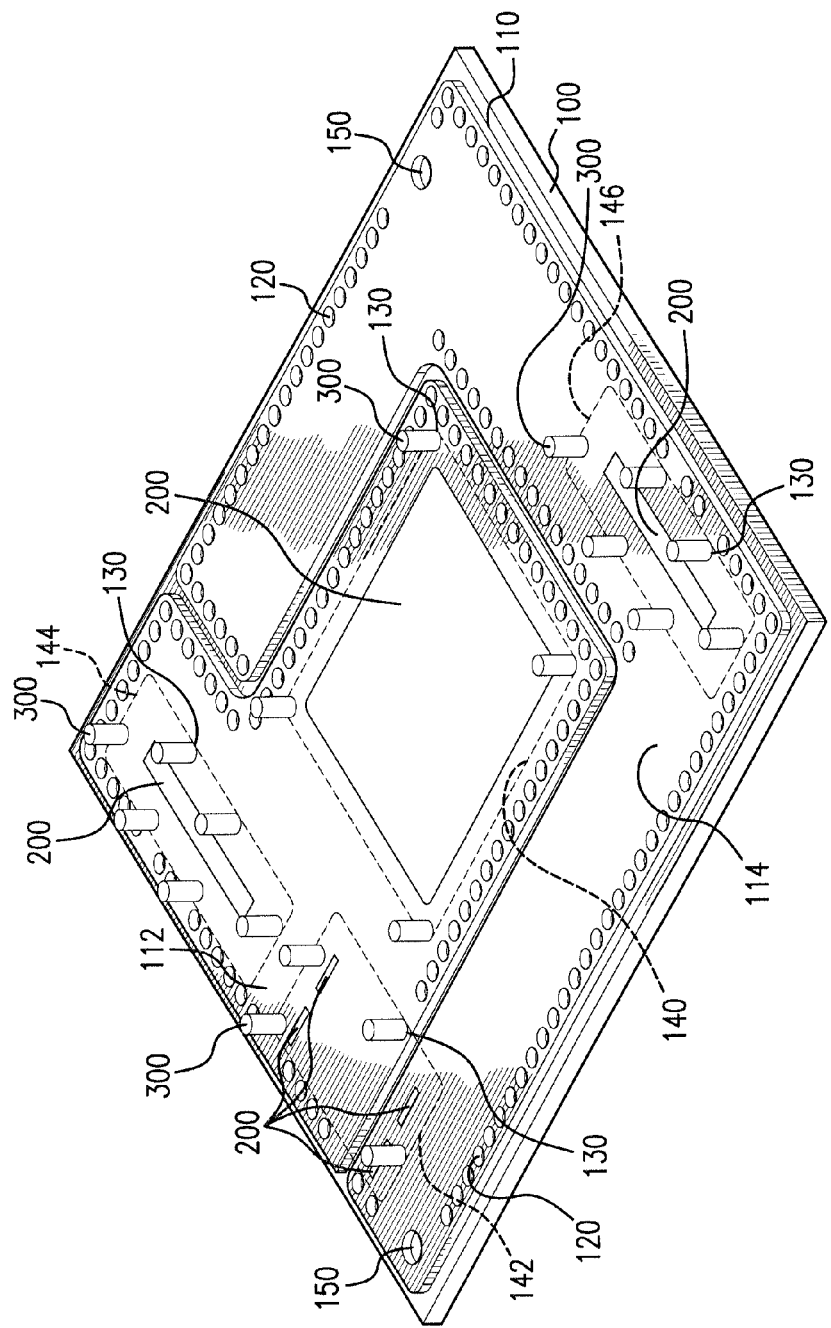
FIG. 3 is a top perspective view of the metallized substrate of FIG. 1 after pegs are inserted in receptacles formed in the metallized substrate.

FIG. 3 illustrates another embodiment of the substrate 100 where the material positioned in the receptacles 130 is a peg 300 such as a pin, post, etc. inserted in each receptacle 130. Different groups of the pegs 300 demarcate the different component attachment regions 140, 142, 144 and 146 and act as mechanical stops, physically preventing the solar cell receiver components from moving outside the respective attachment regions 140, 142, 144 and 146 during solder reflow.

Figure 4:
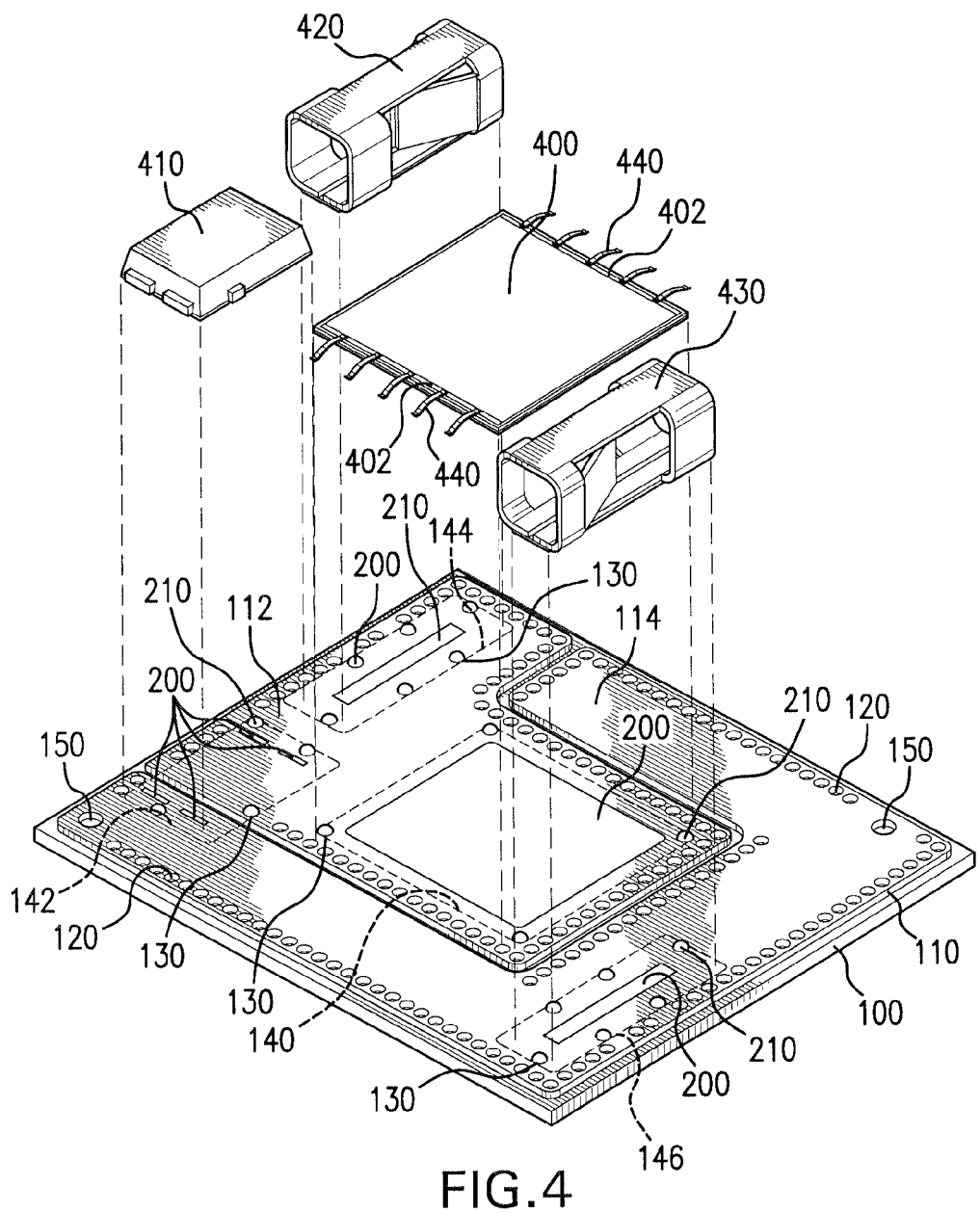
FIG. 4 is a top perspective view of the metallized substrate of FIG. 1 during placement of solar cell receiver components on respective attachment regions of the metallized substrate.
Figure 5:
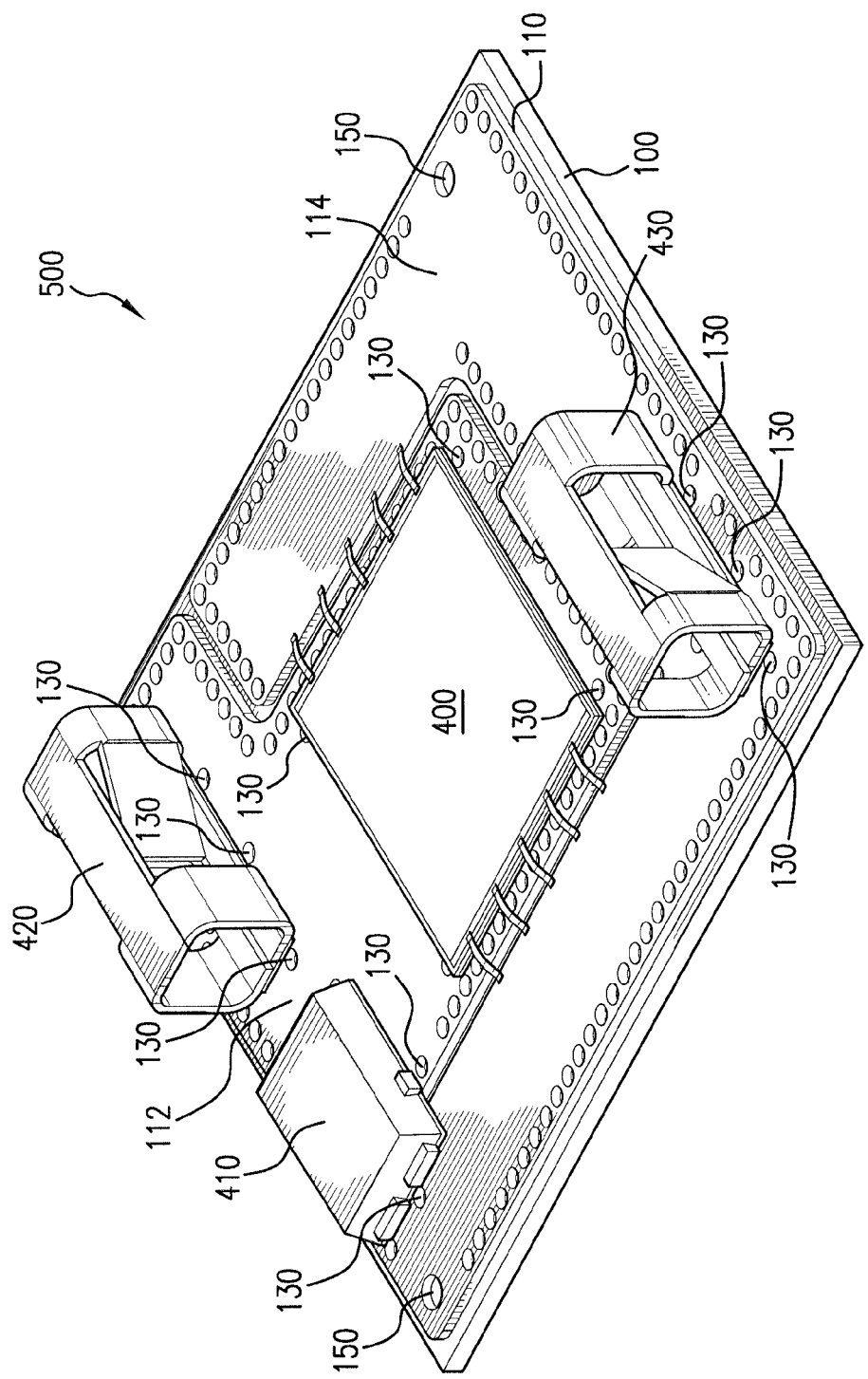
FIG. 5 is a top perspective view of the metallized substrate of FIG. 1 after solar cell receiver components are attached to respective attachment regions of the metallized substrate.

FIG. 4 illustrates the substrate 100 during placement of the solar cell receiver components on the substrate 100 and FIG. 5 illustrates the solar cell receiver 500 after the components are attached to the substrate 100. If the alignment marks 150 are provided, a component placement tool uses the alignment marks 150 as a visual guide for accurately placing the solar cell receiver components on the appropriate attachment regions 140, 142, 144 and 146 of the substrate 100. For example, a solar cell 400 is placed on the first conductive region of the metallized surface 110 on the first attachment region 140 and a bypass diode 410 is placed on a portion of both conductive regions 112 and 144 of the metallized surface 110 on the second attachment region 142. A first connector 420 is placed on the first conductive region 112 on the third attachment region 144 and a second connector 430 is placed on the second conductive region 114 on the fourth attachment region 146.

The solar cell 400, bypass diode 410 and connectors 420 and 430 are then attached to the metallized top side 110 of the substrate 100 by reflowing the solder material 200 previously applied to the substrate 100. Each receptacle 130 is filled with the solder-repelling material 210 or a peg 300 as explained above for collectively preventing the components 400, 410, 420 and 430 from moving beyond the respective attachment regions 140, 142, 144 and 146, yielding a placement accuracy in some embodiments of about +/−0.1 mm for the bypass diode 410 and +/−0.2 mm for the connectors 420 and 430. Selecting an appropriate receptacle size and location yields optimum component positioning control. If the solder repelling material 210 positioned in the receptacles 130 is a solder mask material for preventing solder from flowing outside the respective component attachment regions 140, 142, 144 and 146 during the component attach process, the uncured material can be removed after solder reflow, e.g. using ultrasound cleaning.

In one embodiment, the n-conductivity cathode (i.e. emitter) side of the solar cell receives light and faces away from the substrate. The cathode side of the solar cell 400 is electrically connected to the second conductive region 114 of the metallized surface 110 via one or more bonding wires 440. The p-conductivity anode (i.e. base) side of the solar cell 400 faces the substrate 100 and is electrically connected to the first conductive region 112 of the metallized surface 110 via the solder material 200 applied on the first attachment region 140. The bypass diode 410 couples the first conductive region 112 of the metallized surface 110 to the second conductive region 114.

The functionality of the bypass diode 410 can be appreciated by considering multiple solar cells connected in series. Each solar cell can be envisioned as a battery, with the cathode of each corresponding bypass diode 410 being connected to the positive terminal of the associated "battery" and the anode of each of diode 410 being connected to the negative terminal of the associated "battery." When one of the serially-connected solar cell receivers becomes damaged or shadowed, its voltage output is reduced or eliminated (e.g., to below a threshold voltage associated with the bypass diode). Therefore, the associated bypass diode 410 becomes forward-biased, and a bypass current flows only through that diode 410 (and not the corresponding solar cell). In this manner, the non-damaged or non-shadowed solar cell receivers continue to generate electricity from the solar energy received by each corresponding solar cell 400. If not for the bypass diode 410, substantially all of the electricity produced by the other solar cell receivers would pass through the shadowed or damaged solar cell receiver, destroying it, and creating an open circuit within, e.g., the panel or array.

In one embodiment, a cathode terminal of the bypass diode 410 is connected to the anode terminal of the solar cell 400 via the first conductive region 112 and an anode terminal of the bypass diode 410 is electrically connected to the cathode terminal of the solar cell 400 via the second conductive region 114. The anode terminal of the solar cell 400 is positioned at the lower surface of the solar cell 400 as described above and is out-of-view in FIG. 4. The cathode terminal of the solar cell 400 can be formed by an upper conductive contact area 402 of the solar cell 400. The external connectors 420 and 430 disposed on the metallized top side 110 of the substrate 100 provide for electrical coupling of a device to the solar cell 400 and the bypass diode 410. In some implementations, the connectors 420 and 430 correspond to anode and cathode terminals, and are designed to accept receptacle plugs (not shown) for connection to adjacent solar cell receivers.

Figure 6:
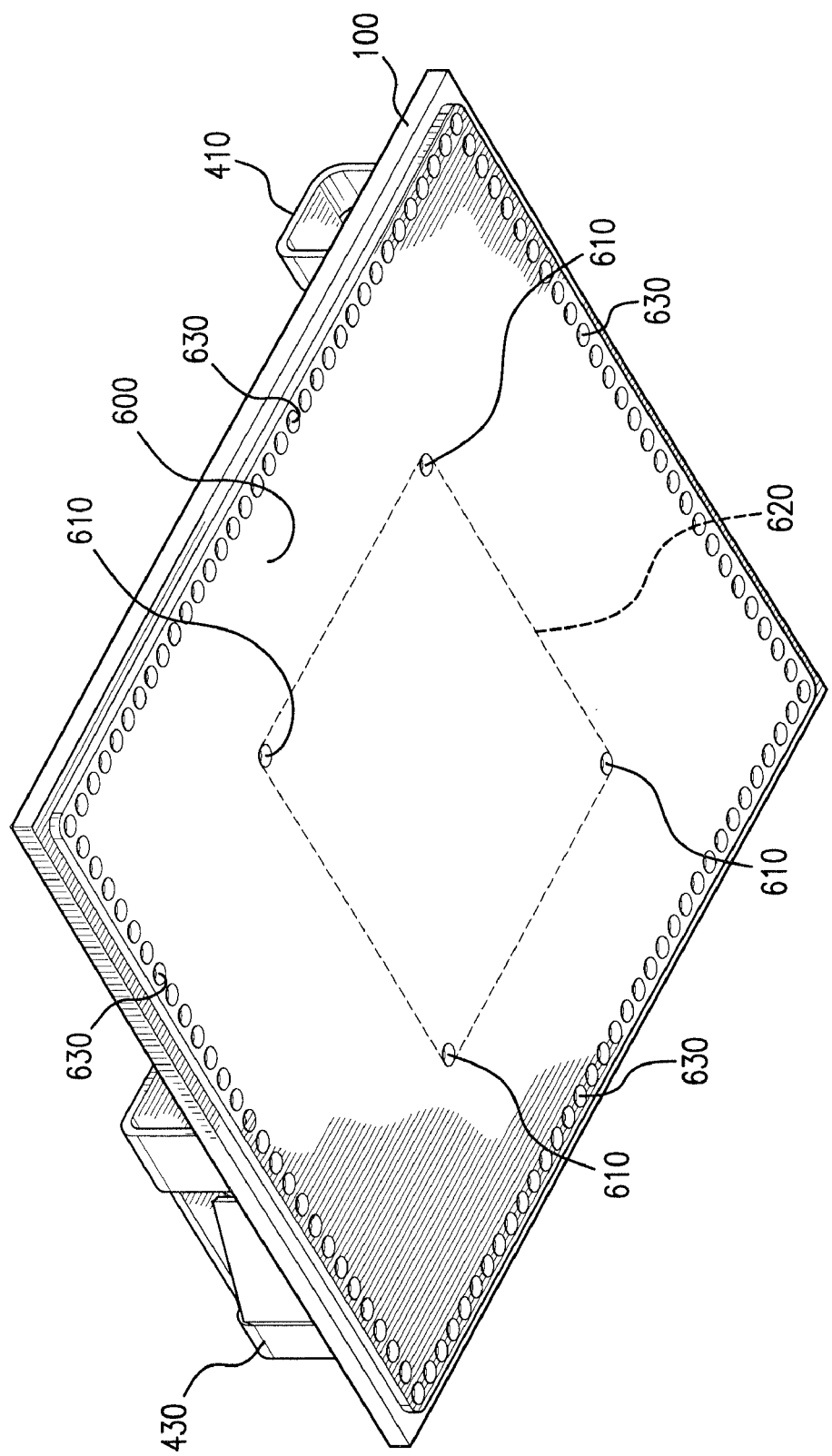
FIG. 6 is a bottom perspective view of the metallized substrate of FIG. 1.

FIG. 6 illustrates the backside 600 of the substrate 100 which can also be metallized. One or more components of the solar cell receiver 500 can be attached to the metallized backside 600 of the substrate 100. For example, the solar cell 400 or other component can be attached to the metallized backside 660. To reduce component movement on the metallized backside 600 of the substrate 100 during solder reflow, receptacles 610 can be provided on the metallized backside 600 for demarcating one or more component attachment regions 620. The backside receptacles 610 are spaced apart from other holes 630 formed in the metallized backside 660 for use in attaching the backside metallization to the substrate 100, e.g. using solder, adhesive, etc. The backside receptacles 610 can be recesses formed in the metallized backside 600 such as divots or dimples, or holes formed through the metallized backside 600 as described previously herein. A single attachment region 620 is shown in FIG. 6, however additional attachment regions can be demarcated by forming additional receptacles in the metallized backside 600. A solder-repelling material or peg can be positioned in each backside receptacle 600 as previously described herein with regard to the metallized top side 110 of the substrate for restricting solder flow or component movement to the corresponding backside attachment region during solder reflow.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A method of manufacturing a solar cell receiver comprising:
   providing an insulative substrate having a metallized surface with a first conductive region separated from a second conductive region, the first conductive region forming a first terminal of the solar cell receiver and the second conductive region forming a second terminal of the solar cell receiver, the metallized surface having receptacles positioned around attachment regions with each attachment region corresponding to a different portion of the metallized surface;
   positioning a material within the receptacles;
   placing a solar cell on the first conductive region and on a first one of the attachment regions;
   placing a second component on a second one of the attachment regions;
   placing a third component on a third one of the attachment regions; and
   attaching the solar cell, the second component, and the third component to the metallized surface,
   wherein positioning the material within the receptacles comprises positioning a solder repellant material within the receptacles that repels solder and maintains the solder within the attachment regions when the solar cell, second component, and third component are attached to the metallized surface.

2. The method of claim 1, wherein a cure temperature of the solder repellant material is higher than a reflow temperature of the solder.

3. The method of claim 1, further comprising aligning the solar cell and the second and third components relative to the metallized surface using alignment marks that are spaced away from the receptacles.

4. The method of claim 1, wherein positioning the material within the receptacles includes positioning the material to extend outward from the receptacles above the metallized surface.

5. The method of claim 1, wherein positioning the material within the receptacles includes positioning a peg within each receptacle that extends outward from the receptacle above the metallized surface.

6. The method of claim 1, wherein the insulative substrate has an additional metallized surface on a backside of the substrate with receptacles demarcating a component attachment region on the backside of the substrate.

7. The method of claim 1, further comprising removing the material from the receptacles after the solar cell, the second component, and the third component are attached to the metallized surface.

8. The method of claim 7, wherein removing the material from the receptacles after the solar cell, the second component, and the third component are attached to the metallized surface includes ultrasonic cleaning of the material from the receptacles.

9. The method of claim 1, wherein placing the second component on the second one of the attachment regions includes placing a bypass diode on the first and second conductive regions and within the second attachment region.

10. The method of claim 9, wherein placing the third component on the third one of the attachment regions includes placing a connector on the first conductive region and within the third attachment region.

11. A method of manufacturing a solar cell receiver comprising:
    providing a substrate with a metallized surface, the metallized surface having alignment marks, and receptacles that extend into the metallized surface and around first and second attachment regions of the metallized surface;
    positioning a solder repelling material within the receptacles;
    aligning a solar cell on the metallized surface based on one or more of the alignment marks and positioning the solar cell in the first attachment region;
    aligning a solar cell receiver component on the metallized surface based on one or more of the alignment marks and positioning the receiver component in the second attachment region; and
    soldering each of the solar cell and the solar cell receiver component to the metallized surface with solder that remains in the attachment regions and is repelled by the solder repelling material positioned in the receptacles.

12. The method of claim 11, wherein positioning the solder repelling material within the receptacles includes positioning the solder repelling material above the metallized surface.

13. The method of claim 11, further comprising removing the solder repelling material from the receptacles after the solar cell and the receiver component are attached to the metallized surface.

14. The method of claim 13, wherein removing the solder repelling material from the receptacles after the solar cell and the receiver component are attached to the metallized surface includes ultrasonic cleaning of the solder removing material from the receptacles.

15. A method of manufacturing a solar cell receiver comprising:
    providing a substrate that includes alignment marks, the substrate also including receptacles around first and second attachment regions;
    positioning a solder repelling material within the receptacles;
    aligning a first component on the substrate based on the alignment marks and positioning the first component in the first attachment region;
    aligning a second component on the substrate based on the alignment marks and positioning the second component in the second attachment region; and soldering each of the first and second components to the substrate while the solder repelling material prevents solder from flowing outside of the first and second attachment regions.

16. The method of claim 15, wherein positioning the solder repelling material within the receptacles includes positioning the solder repelling material above the substrate.

17. The method of claim 15, wherein the first component is a multijunction III-V compound semiconductor solar cell.

18. The method of claim 15, further comprising removing the solder repelling material from the receptacles after the first and second components are soldered to the substrate.

19. The method of claim 18, wherein removing the solder repelling material from the receptacles after the first and second components are soldered to the substrate includes ultrasonic cleaning of the solder removing material from the receptacles.

20. A method of manufacturing a solar cell receiver comprising:
    providing an insulative substrate having a metallized surface with a first conductive region separated from a second conductive region, the first conductive region forming a first terminal of the solar cell receiver and the second conductive region forming a second terminal of the solar cell receiver, the metallized surface having receptacles positioned around attachment regions with each attachment region corresponding to a different portion of the metallized surface that a solar cell receiver component can be placed onto and attached thereto;
    positioning a solder repellant material within the receptacles
    such that the solder repellant material can repel solder and maintain the solder within the attachment regions when a solar cell receiver component is attached to the metallized surface;
    placing a first component on the first conductive region and on a first one of the attachment regions; and
    soldering the first component to the metallized surface with solder that remains in the attachment region and is repelled by the solder repelling material positioned in the receptacles.

21. The method of claim 20, further comprising the steps of:
    placing a second component on a second one of the attachment regions;
    placing a third component on a third one of the attachment regions; and
    attaching the first component, the second component, and the third component to the metallized surface.

22. The method of claim 20, wherein positioning the material within the receptacles includes positioning the material to extend outward from the receptacles above the metallized surface.

23. The method of claim 22, wherein positioning the material within the receptacles includes positioning a peg within each receptacle that extends outward from the receptacle above the metallized surface.

* * * * *